11/27/84 OR 4,485,321

United States Patent [19]

Klicker et al.

[11] Patent Number: 4,485,321

[45] Date of Patent: Nov. 27, 1984

[54] BROAD BANDWIDTH COMPOSITE TRANSDUCERS

[75] Inventors: Kenneth A. Klicker, Allentown; Robert E. Newnham; Leslie E. Cross, both of State College, all of Pa.; Leslie J. Bowen, Waltham, Mass.

[73] Assignee: The United States of America as represented by the Secretary of the Navy, Washington, D.C.

[21] Appl. No.: 344,098

[22] Filed: Jan. 29, 1982

[51] Int. Cl.$^3$ .............................................. H01L 41/04

[52] U.S. Cl. ............................... 310/322; 73/DIG. 4; 310/320; 310/332

[58] Field of Search ........ 310/322, 328, 332, 334–337, 310/345, 364, 800, 340, 365, 366, 320; 367/161, 163, 167, 153, 155, 157; 73/DIG. 4

[56] References Cited

U.S. PATENT DOCUMENTS

| | | | |
|---|---|---|---|
| 2,702,692 | 2/1955 | Kessler | 259/1 |
| 2,797,399 | 6/1957 | Camp et al. | 367/163 |
| 3,056,589 | 10/1962 | Daniel | 259/1 |
| 3,153,156 | 10/1964 | Watlington | 310/8.6 |
| 3,166,730 | 1/1965 | Brown, Jr. et al. | 340/10 |
| 3,249,912 | 5/1966 | Straube | 340/10 |
| 4,013,992 | 3/1977 | Dewberry et al. | 340/10 |
| 4,123,681 | 10/1978 | Barlow | 310/322 |
| 4,234,813 | 11/1980 | Iguchi et al. | 310/366 |
| 4,245,172 | 1/1981 | Shirley | 310/332 |
| 4,350,917 | 9/1982 | Lizzi et al. | 310/320 |
| 4,356,422 | 10/1982 | van Maanen | 310/322 |

FOREIGN PATENT DOCUMENTS

| | | | |
|---|---|---|---|
| 103704 | 11/1980 | Japan | 73/DIG. 4 |

OTHER PUBLICATIONS

Newnham, R. E. et al. "Piezoelectric Transducers", *Materials in Engineering*, v. 2, Dec. '80.

*Primary Examiner*—J. D. Miller
*Assistant Examiner*—D. L. Rebsch
*Attorney, Agent, or Firm*—Robert F. Beers; Arthur A. McGill; Prithvi C. Lall

[57] ABSTRACT

A broad bandwidth electro-mechanical transducer is shaped into a wedge of varying thickness, with a plurality of PZT elements or sheets embedded in an inactive polymer. The transducer is driven at frequencies corresponding to resonance of the thickness dimensions. The piezoelectric elements with different thicknesses are decoupled mechanically from one another using an inactive polymer of low Q so as to prevent interference.

5 Claims, 5 Drawing Figures

BROAD BANDWIDTH COMPOSITE TRANSDUCERS

BACKGROUND OF THE INVENTION

This invention is related to piezoelectric transducers and, more specifically, to a broad bandwidth composite transducer for resonance applications.

Electrical circuits operating at high frequency often require some form of frequency control to limit the pass band of frequencies. This control can take the form of piezoelectric crystal or ceramic elements shaped so as to excite it at a frequency coinciding with the resonance frequency of the piezoelectric element. At resonance frequency, the piezoelectric element or filter has minimum impedance, several orders of magnitude lower than its non-resonance impedance. Consequently, the element readily passes signals at frequencies close to its resonance frequency. The width of the pass band of a filter is defined by the mechanical Q which is given by $Q=f/\Delta f_{3\,dB}$ for Q greater than 10 where f is the center frequency and $\Delta f_{3\,dB}$ is the three decibel (3 dB) pass band. For ceramic piezoelectrics, the mechanical Q is typically in the range of 50–1,000, whereas for a single crystal of quartz, Q may be as high as 100,000. Thus, while narrow pass band filters are readily available, broadband filters having bandwith up to 50% of the center frequency are more difficult to produce. Broadband piezoelectric resonators have applications where fast response to an applied electrical or mechanical signal is required. Previously, bandwidth has been increased by either: (a) electrically connecting narrow bandwidth filters with slightly different resonance frequencies in parallel or (b) damping the resonance of a low Q piezoelectric element in order to spread the resonance peak over a wider frequency range. However, these methods suffer from extreme complexity as in (a) and most of the input energy is wasted by damping, as in the case of (b). It is thus desirable to combine active piezoelectric ceramic elements with an inactive low Q polymer into a high efficiency transducer with a wide bandwidth.

SUMMARY OF THE INVENTION

The objects and advantages of the present invention are accomplished by utilizing a plurality of piezoelectric elements or sheets with different dimensions so as to provide a wide pass band. Various active piezoelectric elements are combined into a single monolithic unit or array using an inactive, low Q polymer which decouples the active elements mechanically and thus prevents interference effects.

An object of the subject invention is to fabricate a broad bandwidth transducer for resonance applications.

Another object of subject invention is to fabricate a broad bandwidth composite transducer for resonance applications.

Still another object of subject invention is to fabricate a broad bandwidth composite transducer wherein a plurality of PZT elements of different thicknesses are embedded in a low Q polymer.

Still another object of subject invention is to fabricate a broad bandwidth composite transducer providing acoustic focusing over a wide range of frequencies.

Other objects, advantages and novel features of the invention will become apparent from the following detailed description of the invention when considered in conjunction with the accompanying drawings wherein:

DESCRIPTION OF PREFERRED EMBODIMENTS

Figure 1:
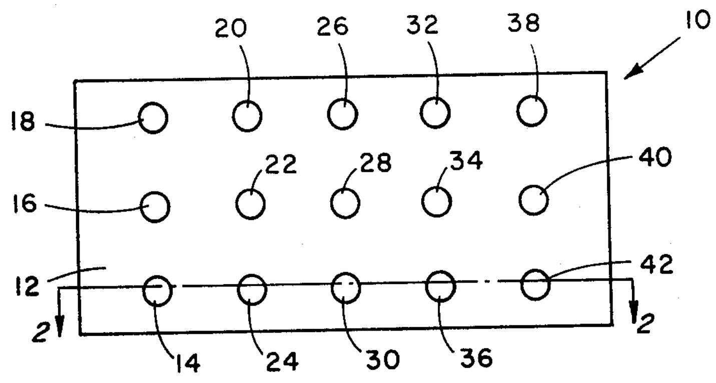
FIG. 1 is a top view of a broad bandwidth composite transducer built according to the teachings of subject invention.
Figure 2:
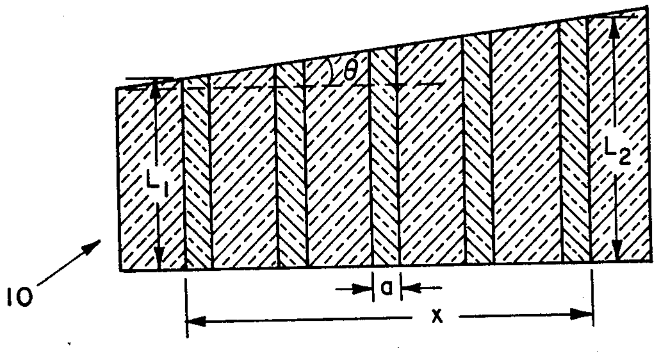
FIG. 2 is a vertical cross section of a broad bandwidth composite transducer of FIG. 1 along line 2—2.
Figure 3:
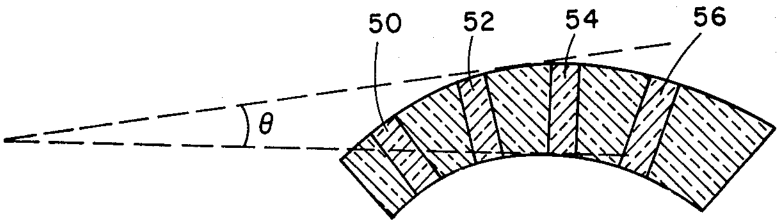
FIG. 3 is another embodiment of a broad bandwidth composite transducer.
Figure 4:
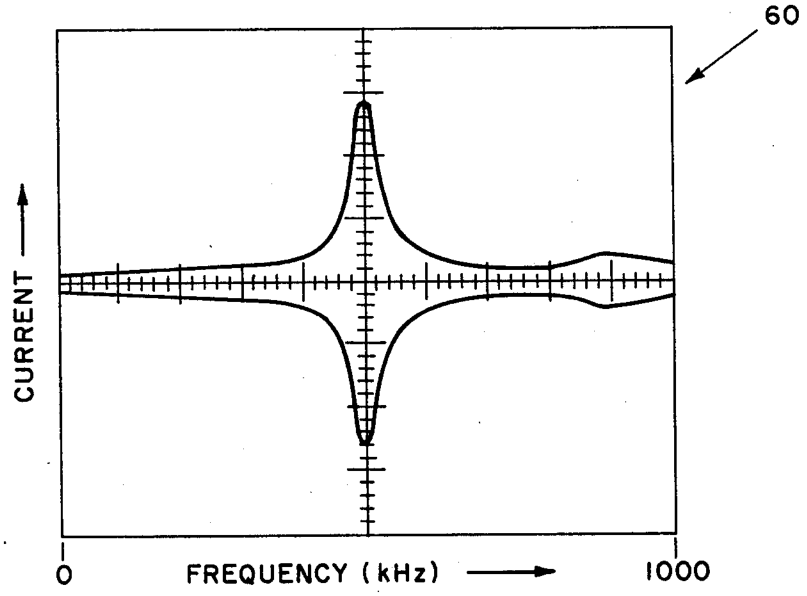
FIGS. 4 and 5 are graphical representations of the frequency responses of a broad bandwidth transducer built according to the teachings of the subject invention.
Figure 5:
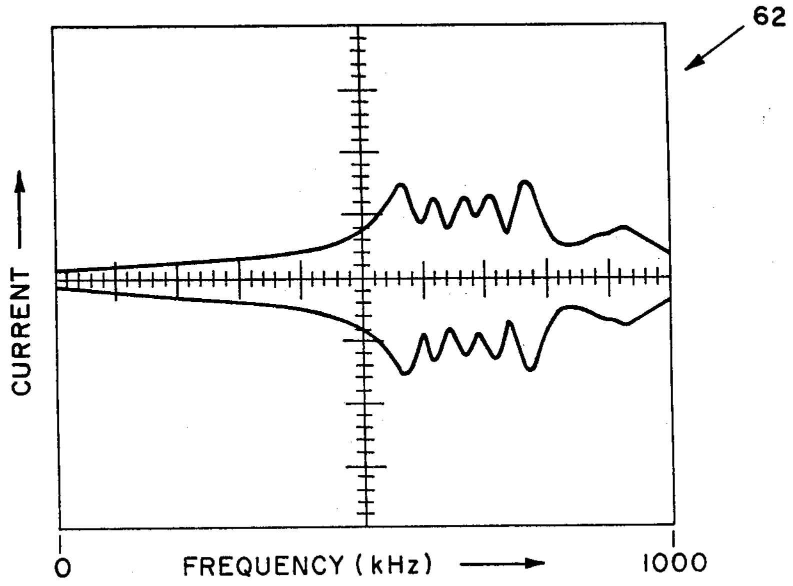

FIG. 1 is a top view of broad bandwidth composite transducer 10 built according to the teachings of subject invention. It includes a relatively inactive low Q polymer 12 and a plurality of PZT elements such as sheets or elements 14–42 having different thicknesses. FIG. 2 represents a vertical cross section of transducer 10. As shown in FIGS. 1 and 2, transducer 10 includes sheets or elements of piezoelectric material laminated with sheet 12 of polymer so that the active elements are separated by sufficient polymer that the mechanical coupling between the active elements is reduced appreciably. Preferably, the edges of the transducer 10 are terminated with a layer of polymer to prevent an acoustic impedance discontinuity, thus avoiding reduction of resonance frequencies of the PZT elements adjacent to the edges. The slope of the transducer, tan $\theta$, defines its bandwidth according to the relationship:

$$\Delta f = \frac{x \tan \theta \cdot f_1 f_2}{N}$$

where $\Delta f$ is the bandwidth in hertz (Hz), $f_1$ and $f_2$ are the resonance frequencies of the elements of lengths $L_1$ and $L_2$ respectively, which are distance x apart, and N is the longitudinal mode frequency constant of the piezoelectric material used. It should be noted that the limiting value of $\theta$ is governed by the natural bandwidth of the piezoelectric as:

$$\tan \theta = \frac{\Delta f}{f} \cdot \frac{\bar{L}}{a}$$

where $\Delta f/f$ is the natural bandwidth of the active element (within a given signal level, say 3 dB), $\bar{L}$ is the mean thickness of the composite, and the element width is a. It should be noted that FIG. 3 is a representation of another embodiment wherein various active elements or sheets 50–56 and the intervening sheets of the inactive polymer have been arranged so as to obtain a "convex mirror" configuration to provide acoustic focusing over a wide range of frequencies. It should further be noted that by way of illustration rather than as a limitation, a composite of 30 volume % of soft PZT ceramic fibers poled along their lengths and aligned in an epoxy resin matrix was used. This composite has the advantage over the lamellar composite for accepting any surface profile and thus providing greater versatility in application. FIGS. 4 and 5 are graphical representations of the frequency spectra from 0 to 1 MHz (1 MHz$=10^6$ hertz) for 30 volume percent PZT fiber composites with their opposite faces (i.e. faces inclined to the fiber length) inclined at 2° and 10° respectively. The 3 dB bandwidth was increased from 7% for the composite with faces ground parallel, to 11% for the 2° composite, and to 45% for the faces inclined at 10°. FIGS. 4 and 5 are respectively graphical representations 60 and 62 wherein the vertical axis thereof represents the current on the same linear scale with the horizontal axis representing the frequency in kilohertz (kHz).

Briefly described, a wide bandwidth composite transducer is disclosed which includes a plurality of active PZT elements of varying thicknesses separated by an inactive low Q polymer. The inactive polymer decouples mechanically the various active PZT elements.

Obviously, many modifications and variations of the present invention are possible in the light of the above teachings. As an example, configurations other than those described and shown above can be used without deviating from the teachings of the subject invention. Furthermore, different types of composite materials can also be used. Furthermore, various configurations of the transducer can be fabricated depending upon its use. It is, therefore, understood that within the scope of the appended claims the invention may be practiced other than as specifically described.

What is claimed is:

1. A broad bandwidth composite transducer which comprises:

a plurality of piezoelectric sheets each of which being of different thickness; and an inactive polymer having said plurality of piezoelectric sheets embedded therein so as to mechanically decouple each member of said plurality of piezoelectric sheets from the remaining sheets thereof; and said plurality of piezoelectric sheets and said inactive polymer form a monolithic composite material for said composite transducer.

2. The composite transducer of claim 1 wherein the edges thereof are terminated with a layer of said inactive polymer to avoid reduction in resonant frequency of the piezoelectric sheets adjacent to the edges.

3. The composite transducer of claim 2 wherein said inactive polymer has a low Q value.

4. The composite transducer of claim 3 wherein said plurality of piezoelectric sheets and said inactive polymer are arranged in a convex mirror configuration to provide acoustic focusing over a wide range of frequencies.

5. The composite transducer of claim 4 wherein faces thereof are inclined to the piezoelectric sheet length to increase bandwidth thereof.

* * * * *